US011924319B2

(12) United States Patent
Takahashi

(10) Patent No.: US 11,924,319 B2
(45) Date of Patent: Mar. 5, 2024

(54) TIME SYNCHRONIZATION DEVICE, TIME SYNCHRONIZATION SYSTEM, AND TIME SYNCHRONIZATION METHOD

(71) Applicant: NEC Platforms, Ltd., Kawasaki (JP)

(72) Inventor: Masayuki Takahashi, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 34 days.

(21) Appl. No.: 17/795,595

(22) PCT Filed: Jan. 13, 2021

(86) PCT No.: PCT/JP2021/000903
§ 371 (c)(1),
(2) Date: Jul. 27, 2022

(87) PCT Pub. No.: WO2021/157308
PCT Pub. Date: Aug. 12, 2021

(65) Prior Publication Data
US 2023/0077120 A1   Mar. 9, 2023

(30) Foreign Application Priority Data

Feb. 5, 2020   (JP) ................. 2020-018117

(51) Int. Cl.
*H04L 7/033* (2006.01)
*G06F 1/12* (2006.01)
(52) U.S. Cl.
CPC .............. *H04L 7/0331* (2013.01); *G06F 1/12* (2013.01)
(58) Field of Classification Search
CPC ..................... G06F 1/12; G06F 1/10
See application file for complete search history.

(56) References Cited

U.S. PATENT DOCUMENTS 5,588,004 A * 12/1996 Suzuki ................. H04J 3/0685
370/516
5,734,301 A *  3/1998 Lee .......................... H03L 7/07
331/25

(Continued)

FOREIGN PATENT DOCUMENTS

JP   2013-034157 A    2/2013
JP   2016-225880 A   12/2016

(Continued)

OTHER PUBLICATIONS

International Search Report for PCT Application No. PCT/JP2021/000903, dated Apr. 20, 2021.

(Continued)

*Primary Examiner* — Phil K Nguyen
(74) *Attorney, Agent, or Firm* — Sughrue Mion, PLLC

(57) ABSTRACT

A slave device (10) includes a frequency synchronization unit (11) configured to generate frequency control information synchronized with a frequency of a synchronous Ethernet (registered trademark) signal received from a master device (20), a time synchronization unit (12) configured to generate time control information synchronized with a time based on a time packet received from the master device (20), and a time synchronization signal generation unit (13) configured to generate a time synchronization signal based on the frequency control information and the time control information. The frequency synchronization unit (11) includes a frequency synchronizing PLL including a DCO (11a) configured to output the frequency control information, and the time synchronization unit (12) includes a time synchronizing PLL including a DCO (12a) configured to output the time control information.

9 Claims, 9 Drawing Sheets

(56) References Cited

U.S. PATENT DOCUMENTS

| | | | | |
|---|---|---|---|---|
| 5,936,565 A * | 8/1999 | Bogdan | ............... | G06F 1/025 |
| | | | | 341/152 |
| 9,166,704 B1 * | 10/2015 | Nagarajan | ........... | H04J 14/0221 |
| 9,184,909 B1 * | 11/2015 | McCracken | ............ | H04L 7/042 |
| 10,511,312 B1 * | 12/2019 | Pastorello | ............... | H03L 7/081 |
| 2002/0075980 A1 * | 6/2002 | Tang | ................ | G06F 5/12 |
| | | | | 375/372 |
| 2004/0066872 A1 * | 4/2004 | Hsu | ................ | H03L 7/0891 |
| | | | | 375/376 |
| 2015/0349991 A1 * | 12/2015 | Iyer | ................ | H04L 7/0062 |
| | | | | 375/233 |
| 2018/0059159 A1 * | 3/2018 | Hsu | ................ | H03K 5/19 |
| 2021/0224218 A1 * | 7/2021 | Lin | ................ | G06F 13/4282 |
| 2022/0021393 A1 * | 1/2022 | Ravid | ............... | G06F 1/12 |

FOREIGN PATENT DOCUMENTS

| | | |
|---|---|---|
| JP | 2018-093369 A | 6/2018 |
| WO | 2014/083725 A1 | 6/2014 |

OTHER PUBLICATIONS

JP Office Action for JP Application No. 2020-018117, dated Apr. 13, 2021 with English Translation.

Yoshida, Seiji, "The trend of Synchronous Ethernet Technologies", Proceedings of The 2012 IEICE General Conference, Mar. 6, 2012, pp. SS-74 to SS-77, section 5.

* cited by examiner

TIME SYNCHRONIZATION DEVICE, TIME SYNCHRONIZATION SYSTEM, AND TIME SYNCHRONIZATION METHOD

This application is a National Stage Entry of PCT/JP2021/000903 filed on Jan. 13, 2021, which claims priority from Japanese Patent Application 2020-018117 filed on Feb. 5, 2020, the contents of all of which are incorporated herein by reference, in their entirety.

TECHNICAL FIELD

The present disclosure relates to a time synchronization device, a time synchronization system, and a time synchronization method.

BACKGROUND ART

A technique for implementing time synchronization between devices via a network such as Ethernet (registered trademark) has been standardized by IEEE (Institute of Electrical and Electronics Engineers) in IEEE 1588v2 (IEEE 1588-2008). IEEE 1588v2 is generally referred to as "PTP (Precision Time Protocol)" and is also referred to herein as "PTP".

In the PTP, a time packet in which a time is stamped is transmitted and received between a master device and a slave device, and time synchronization is performed from a transmission delay time of the time packet. In the PTP, frequency synchronization is also performed by transmitting a synchronous Ethernet signal (SyncE) from the master device to the slave device. The time synchronization may include frequency synchronization for matching frequencies of clocks.

In addition, the ITU-T (International Telecommunication Union Telecommunication Standardization Sector) has developed a frequency synchronization technique (G. 826x series including G. 8262) and a time synchronization technique (G. 827x series including G. 8273.2), which are extensions of IEEE 1588v2 for telecommunications carriers. For example, Patent Literature 1 is known as a related technique.

CITATION LIST

Patent Literature

Patent Literature 1: Japanese Unexamined Patent Application Publication No. 2016-225880

SUMMARY OF INVENTION

Technical Problem

In order to achieve time synchronization using synchronous Ethernet signals in a slave device of the PTP, it is necessary to implement frequency synchronization processing in accordance with the definition of ITU-T G. 8262 and time synchronization processing in accordance with the definition in ITU-T G. 8273.2. However, these standards do not disclose specific methods for achieving or implementing frequency and time synchronization processing. Therefore, depending on the method for implementing the frequency and time synchronization, there is a problem that the accuracy of the time synchronization may be deteriorated due to an influence of an ultra-low frequency wander or the like superimposed on the synchronous Ethernet signal.

The present disclosure has been made in light of such a problem and an object thereof is to provide a time synchronization device, a time synchronization system, and a time synchronization method capable of improving accuracy of time synchronization.

Solution to Problem

In an example aspect of the present disclosure, a time synchronization device includes: a frequency synchronization unit configured to generate frequency control information synchronized with a frequency of a synchronous Ethernet (registered trademark) signal received from a time master device; a time synchronization unit configured to generate time control information synchronized with a time based on a time packet received from the time master device; and a time synchronization signal generation unit configured to generate a time synchronization signal based on the generated frequency control information and the generated time control information. The frequency synchronization unit includes a frequency synchronizing PLL (Phase Locked Loop) including a first digital controlled oscillator configured to output the frequency control information, and the time synchronization unit includes a time synchronizing PLL including a second digital controlled oscillator configured to output the time control information.

In another example aspect of the present disclosure, a time synchronization system includes: a time master device and a time slave device. The time slave device includes: a frequency synchronization unit configured to generate frequency control information synchronized with a frequency of a synchronous Ethernet (registered trademark) signal received from a time master device; a time synchronization unit configured to generate time control information synchronized with a time based on a time packet received from the time master device; and a time synchronization signal generation unit configured to generate a time synchronization signal based on the generated frequency control information and the generated time control information. The frequency synchronization unit includes a frequency synchronizing PLL (Phase Locked Loop) including a first digital controlled oscillator configured to output the frequency control information, and the time synchronization unit includes a time synchronizing PLL including a second digital controlled oscillator configured to output the time control information.

In another example aspect of the present disclosure, a time synchronization method includes: generating, by a first digital controlled oscillator included in a frequency synchronizing PLL (Phase Locked Loop), control information synchronized with a frequency of a synchronous Ethernet (registered trademark) signal received from a time master device; generating, by a second digital controlled oscillator included in a time synchronizing PLL, time control information synchronized with a time based on a time packet received from the time master device; and generating a time synchronization signal based on the generated frequency control information and the generated time control information.

Advantageous Effects of Invention

According to the present disclosure, it is possible to provide a time synchronization device, a time synchronization system, and a time synchronization method capable of improving accuracy of time synchronization.

EXAMPLE EMBODIMENT

An example embodiment will be described below with reference to the drawings. In each of the drawings, the same elements are denoted by the same reference signs, and repeated explanations are omitted if necessary. The arrows attached to the configuration diagrams are illustrative only and do not limit the types or directions of signals.

Comparative Example

Figure 1:
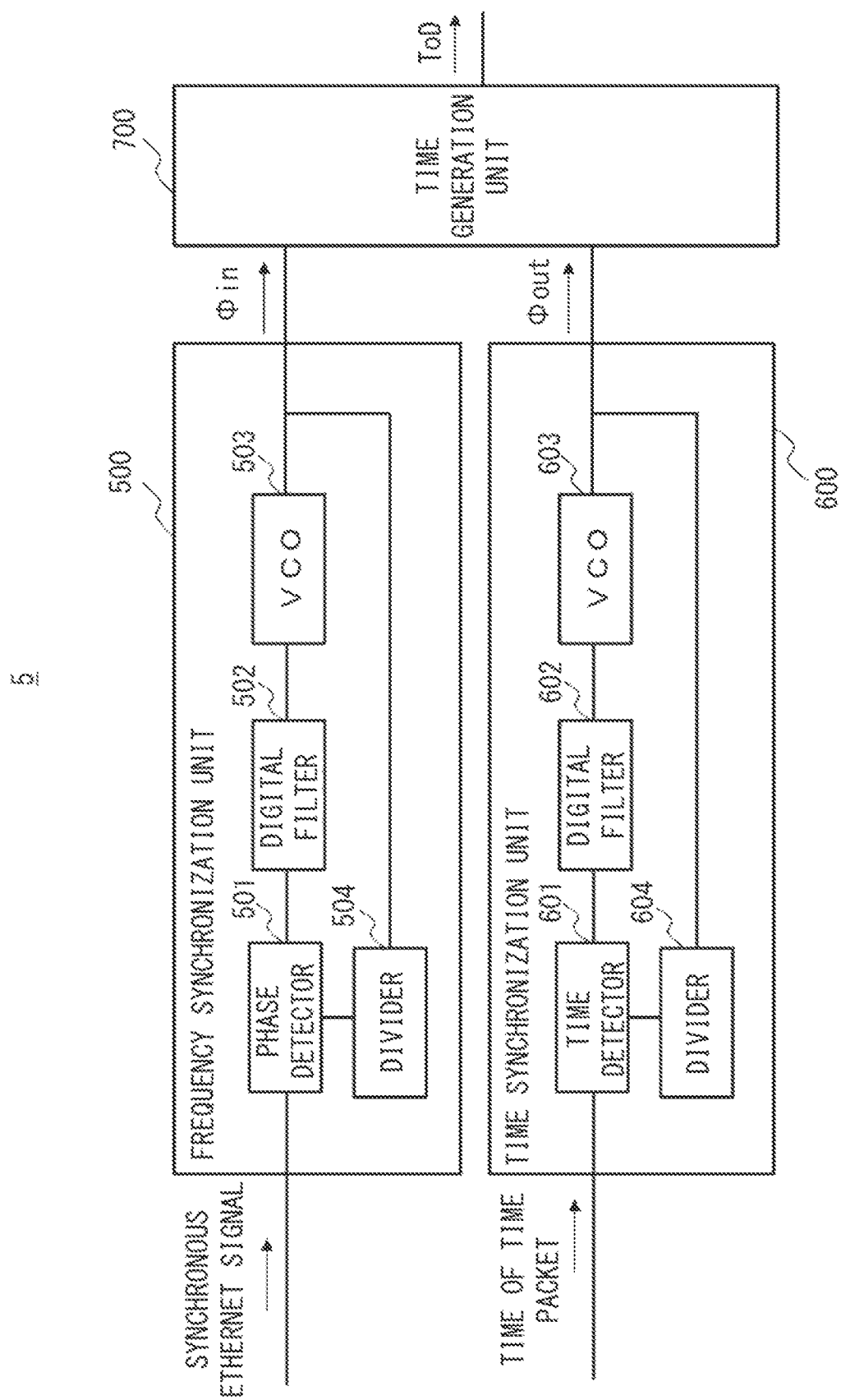
FIG. 1 is a configuration diagram showing a configuration of an equivalent block of a time synchronization device according to a comparative example.
Figure 2:
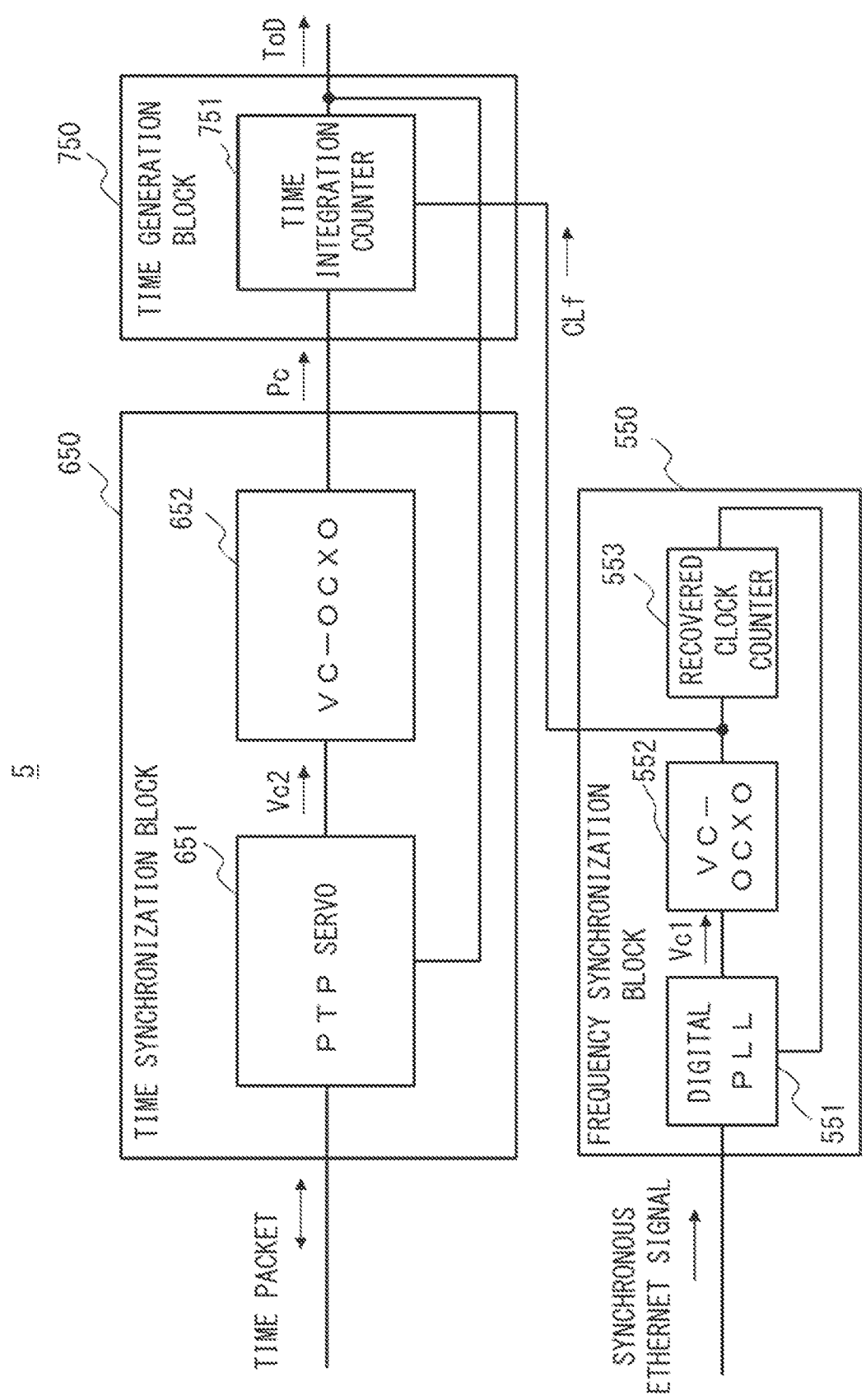
FIG. 2 is a configuration diagram showing a configuration of a logic block of the time synchronization device according to the comparative example.

First, a comparative example before the application of the example embodiment will be described. FIG. 1 shows a configuration of an equivalent block (an equivalent block on an s-plane) of a time synchronization device 5 according to the comparative example. FIG. 2 shows a configuration of a logic block (an implementation block) embodying the equivalent block of FIG. 1. The time synchronization device 5 is a slave device of the PTP which performs time synchronization by using a synchronous Ethernet signal and a time packet received from a master device of the PTP.

As shown in FIG. 1, the equivalent block of the time synchronization device 5 according to the comparative example has the same configuration as that of a common slave device using a synchronous Ethernet signal, and includes a frequency synchronization unit 500, a time synchronization unit 600, and a time generation unit 700.

The functions required for the frequency synchronization unit 500 are formally recommended in ITU-T G.8262. ITU-T G. 8262 defines a loop band (high-frequency cutoff frequency) of the frequency synchronization unit 500 is to be set between 1 Hz and 10 Hz. The frequency synchronization unit 500 is a frequency synchronizing PLL (Phase Locked Loop) circuit that generates a synchronization signal Φin synchronized with a frequency of the synchronous Ethernet signal in order to support a required function. The frequency synchronization unit 500 includes a Phase Detector (a phase comparator) 501, a digital filter 502, a VCO (Voltage Controlled Oscillator) 503, and a Divider (a frequency divider) 504 as examples of the configuration of the PLL circuit.

The phase detector 501 outputs a result of comparing a phase of the synchronous Ethernet signal received from the master device with that of a divided signal from the divider 504. The VCO 503 outputs the synchronization signal Φin having a frequency corresponding to the result of the phase comparison (voltage) via the digital filter (a low-pass filter) 502 to the time generation unit 700 and feeds it back to the divider 504.

Like the frequency synchronization unit, the functions required for the time synchronization unit 600 are formally recommended in ITU-T G.8273.2. ITU-T G. 8273.2 defines a loop band of the time synchronization unit 600 is to be set between 0.05 Hz and 0.1 Hz. The time synchronization unit 600 is a time synchronizing PLL circuit (time servo) that generates a synchronization signal Φout synchronized with a time (phase) of the time packet of the PTP. Like the frequency synchronization unit 500, the time synchronization unit 600 includes a time detector (a time comparator) 601, a digital filter 602, a VCO 603, and a divider 604 as examples of the configuration of the PLL circuit.

The time detector 601 outputs a result of time comparison between the time (phase) based on time packets T1 to T4 transmitted to and received from the master device and the time of the divided signal from the divider 604. The VCO 603 outputs the synchronization signal Φout at a timing corresponding to the result of time comparison (voltage) via the digital filter 602 to the time generation unit 700 and feeds it back to the divider 604.

The time generation unit 700 generates a time synchronization signal ToD (Time of Day: a time synchronization clock) of $\Phi_{in}+\Phi_{out}$ by performing offset control based on the timing of the synchronization signal Φout output from the VCO 603 of the time synchronization unit 600 on the basis of the frequency of the synchronization signal Φin output from the VCO 503 of the frequency synchronization unit 500. The time synchronization signal ToD is a clock signal having the same frequency as that of Φin, which is an original clock, and is synchronized with the timing (phase) of Φout. For example, the time synchronization signal ToD is a 10 MHz and 1 pps (Pulse Per Second) signal.

As shown in FIG. 2, in comparison to the equivalent block of FIG. 1, a logic block of the time synchronization device 5 according to the comparative example includes a frequency synchronization block 550 corresponding to the frequency synchronization unit 500, a time synchronization block 650 corresponding to the time synchronization unit 600, and a time generation block 750 corresponding to the time generation unit 700.

The frequency synchronization block 550 includes a digital PLL 551, a VC-OCXO (Voltage Controlled-Oven Controlled Crystal Oscillator) 552, and a recovered clock counter (RECCTR) 553. The digital PLL 551 and the recovered clock counter 553 correspond to the phase detector 501, the digital filter 502, and the divider 504 in FIG. 1, and the VC-OCXO 552 corresponds to the VCO 503 in FIG. 1. The digital PLL 551 generates a frequency/phase control voltage Vc1 based on the result of comparison between the phase of the synchronous Ethernet signal and the phase of the recovered clock from the recovered clock counter 553. The VC-OCXO 552 outputs a frequency synchronization clock CLf based on the frequency/phase control voltage Vc1 generated by the digital PLL 551.

The time synchronization block 650 includes a PTP servo 651 and a VC-OCXO 652. The PTP servo 651 corresponds to the time detector 601, the digital filter 602, and the divider 604 in FIG. 1, and the VC-OCXO 652 corresponds to the VCO 603 in FIG. 1. The PTP servo 651 transmits and receives time packets T1 to T4 to and from the master device, stamps the time on the time packets T2 and T3 based on the ToD signal from the time generation block 750, and generates a time control voltage Vc2 based on the time of the time packets T1 to T4. The VC-OCXO 652 outputs a time control signal (a phase control signal) Pc based on the time control voltage Vc2 generated by the PTP servo 651.

The processing of extracting time information from the time packets performed by the PTP servo 651 is generally known as time servo processing of the PTP. Specifically, in the PTP, a time packet T1 (Sync Message), a time packet T2 (Follow-up Message), a time packet T3 (Delay Request Message), and a time packet T4 (Delay Response Message) are transmitted and received between the master device and the slave device, and the times of these transmission and reception are used. A transmission delay time in a downstream direction is calculated from a difference between the time (t1) when the master device transmits the time packet T1 and the time (t2) when the slave device receives the time packet T1, a transmission delay time in an upstream direction is calculated from a difference between the time (t3) when the slave device transmits the time packet T3 and the time (t4) when the master device receives the time packet T3, and the time information is generated based on these transmission delay times. Here, the time information obtained by the time servo processing is assumed to be the time based on the time packets or the times extracted from the time packets.

The time generation block 750 includes a time integration counter 751. The time integration counter 751 generates a clock signal based on the frequency synchronization clock output from the VC-OCXO 552 of the frequency synchronization block 550 in accordance with the timing (phase) of the time control signal output from the VC-OCXO 652 of the time synchronization block 650, and outputs the generated clock signal as the ToD signal.

As described above, in the comparative example, the equivalent block shown in FIG. 1 can be implemented by employing a mounting configuration shown in FIG. 2. As a result of examining the configuration according to this comparative example, the inventor has found the following problem. Specifically, the synchronous Ethernet signal is transmitted from the master device via a long-distance Ethernet transmission line of, for example, 50 to 100 km. As a result, high-frequency jitter and low frequency wander are generated in the transmission line, and in particular, "ultra-low frequency wander (0.1 Hz or less)" of the order of several tens of las is generated due to thermal noise, seasonal variation, etc.

However, if a time synchronization device using the synchronous Ethernet is implemented with the configuration shown in FIG. 2 to achieve the equivalent block shown in FIG. 1, an influence of the ultra-low frequency wander cannot be prevented or reduced. In the configuration according to the comparative example, although the high-frequency jitter superimposed on the synchronous Ethernet signal is removed by the frequency synchronization unit 500, the ultra-low frequency wander superimposed on the synchronous Ethernet signal is not removed by the frequency synchronization unit 500, so that the ultra-low frequency wander remains superimposed on the synchronization signal Φin. As a result, a time synchronized with the signal including the ultra-low frequency wander is generated by the time generation unit 700, and therefore the accuracy of time synchronization is lowered.

For this reason, for example, in a cellular phone base station such as 5G, a time synchronization accuracy of "±1.5 µs or less" is required, but the time synchronization accuracy may not be satisfied. When radio waves are transmitted from adjacent cellular phone base stations at the same timing, the radio waves interfere with each other, so that time synchronization with high accuracy is required. Therefore, if the time synchronization accuracy continues to fail to meet the standard, an interference of radio waves transmitted from the cellular phone base station will eventually occur, causing a decrease in a throughput.

Further, in the comparative example, since both the voltage-controlled oscillator (VCO) for frequency synchronization and the voltage-controlled oscillator (VCO) for time synchronization are required, there are also problems in terms of circuitry such as an increase in a mounting area, an increase in cost, an increase in power consumption, and the need for an analog circuit.

(Outline of Example Embodiment)

As described below, the example embodiment is characterized in a PLL configuration using a DCO (Digital Controlled Oscillator) in a slave device of the PTP which performs time synchronization using a synchronous Ethernet signal. This enables the slave device to serve also as a high-pass filter while being a PLL and thus to reduce an influence of the "ultra-low frequency wander" on stamping accuracy even when a synchronous Ethernet signal with a superimposed "ultra-low frequency wander", which is a drawback of the comparative example, is used as an original frequency of the time, thereby enabling highly accurate time synchronization.

Figure 3:
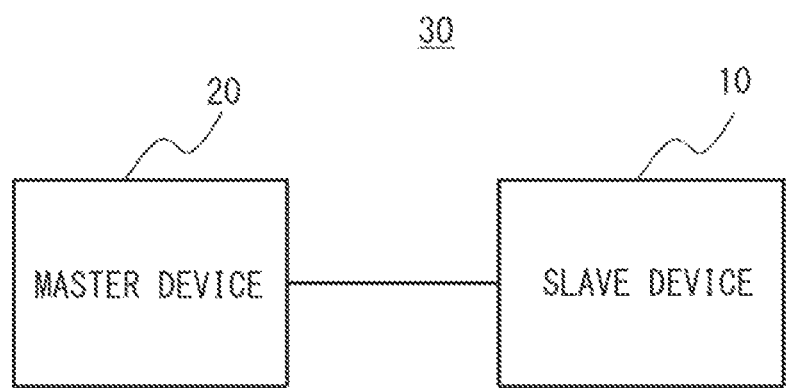
FIG. 3 is a configuration diagram showing a schematic configuration of a time synchronization system according to an example embodiment.
Figure 4:
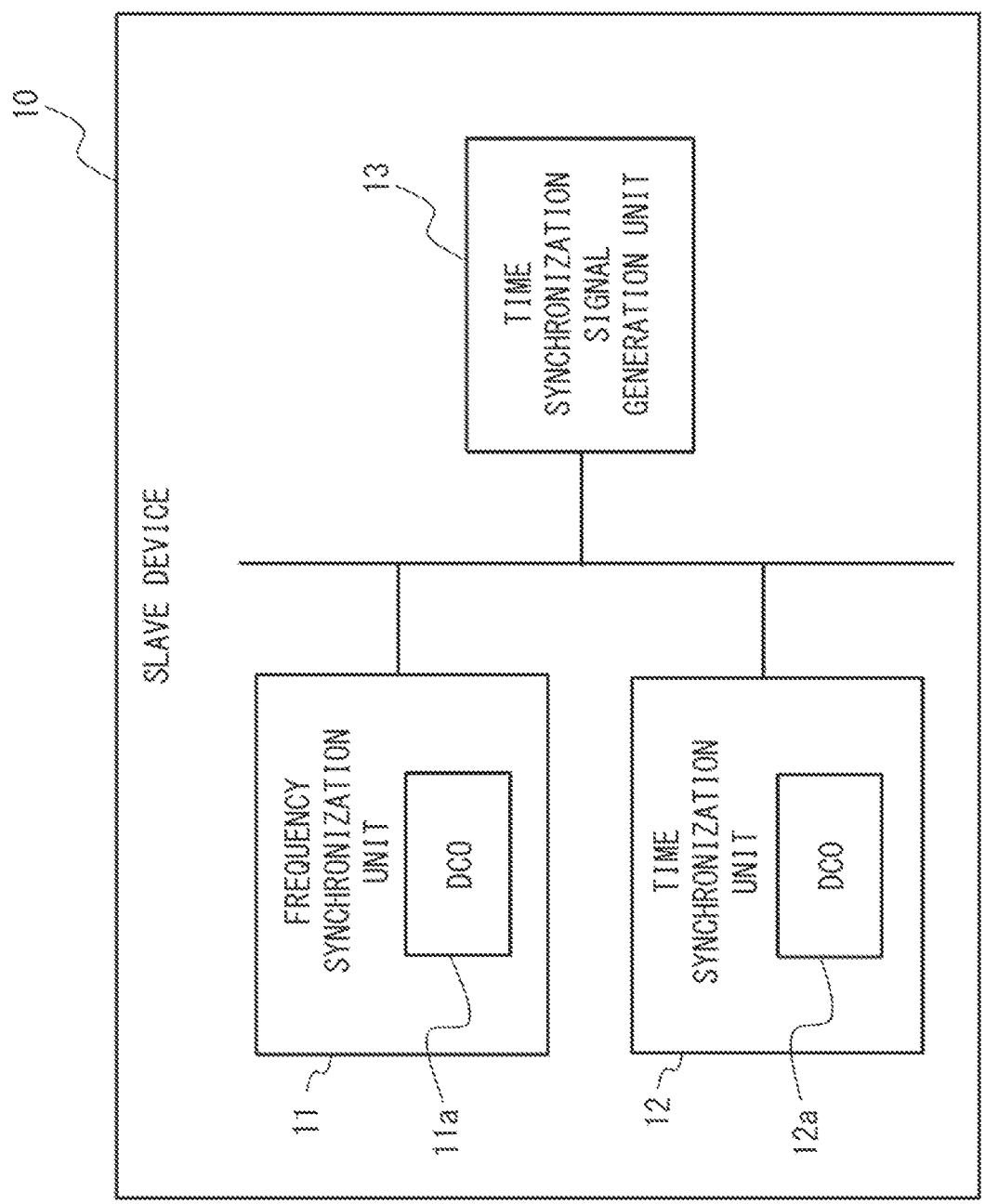
FIG. 4 is a configuration diagram showing a schematic configuration of a slave device according to the example embodiment.

FIG. 3 is a configuration diagram showing a schematic configuration of a time synchronization system according to an example embodiment of the present disclosure. FIG. 4 is a configuration diagram showing a schematic configuration of a slave device (a time synchronization device) according to the example embodiment. As shown in FIG. 3, a time synchronization system 30 includes a master device (a time master device) 20 and a slave device (a time slave device) 10 connected to each other via a network such as Ethernet.

For example, the master device 20 is a time reference device (PRTC (Primary Reference Time Clock)) having a master clock, and the slave device 10 is a cellular phone base station that operates in synchronization with the master clock (time) of the time reference device. The master device 20 transmits a time packet in which a time of the master clock is stamped to the slave device 10, and transmits a synchronous Ethernet signal (a frequency synchronization signal of a physical layer) of a frequency of the master clock to the slave device 10.

As shown in FIG. 4, the slave device 10 includes a frequency synchronization unit 11, a time synchronization unit 12, and a time synchronization signal generation unit 13. The frequency synchronization unit 11 receives the synchronous Ethernet signal from the master device 20 and generates frequency control information synchronized with the frequency of the received synchronous Ethernet signal. The time synchronization unit 12 receives a time packet from the master device 20 and generates time control information synchronized with the time based on the received time packet, and the time synchronization signal generation unit 13 generates a time synchronization signal based on the frequency control information generated by the frequency synchronization unit 11 and the time control information generated by the time synchronization unit 12.

The frequency synchronization unit 11 includes a frequency synchronizing PLL including a DCO 11a (a first digital controlled oscillator) that outputs a frequency control signal. The time synchronization unit 12 includes a time synchronizing PLL including a DCO 12a (a second digital controlled oscillator) that outputs a time control signal. The time synchronization signal generation unit 13 generates the time synchronization signal based on a value obtained by adding the frequency control information and the time control information. As an implementation example, the time synchronization unit may include an addition unit for adding the frequency control information and the time control information. For example, as an example of the equivalent block to be achieved, the DCO 12a may output a value obtained by adding the frequency control information and the time control information output from the DCO 11a. Thus, the frequency synchronizing PLL and the time synchronizing PLL constitute a high-pass filter for removing a low frequency component of the synchronous Ethernet signal.

As described above, in order to solve the problem in the comparative example, in the example embodiment, as shown in FIG. 4, the PLL circuit of the frequency synchronization unit and the PLL circuit of the time synchronization unit are composed of DCOs. This makes it possible for the frequency synchronization unit and the time synchronization unit to become high-pass filters even if they are PLL circuits. Note that the frequency synchronization unit and the time synchronization unit here actually each have a configuration of a band pass filter but in this example, they are defined as the high-pass filters for convenience. Further note that commonly a PLL circuit can constitute only a low-pass filter, and further, a high-pass filter for phase noise cannot be easily implemented.

As a result, it is possible to remove an "ultra-low frequency wander" caused by thermal noise, seasonal variation, or the like in the synchronous Ethernet signal, thereby improving the accuracy of time synchronization. For example, the time synchronization accuracy can be controlled to "±1.5 μs or less", which is regarded as an essential accuracy in the cellular phone base station.

Although the accuracy of time synchronization is formally recommended in ITU-T G. 8273.2, a scheme of achieving the accuracy of time synchronization and a method of implementing the same are not described and treated as a vendor issue. Therefore, the example embodiment focuses on a scheme of achieving such a high-pass filter and a method of implementing the same, which are not described in ITU-T.

Further, by employing a configuration including a DCO, only one oscillator is sufficient, and further, it is possible to achieve a fixed oscillator that does not require voltage control. That is, in contrast to the configuration including two VCOs in the comparative example, a configuration according to the example embodiment includes one fixed oscillator. Furthermore, since the circuit can be made into a full digital circuit, an analog circuit becomes unnecessary, and a mounting area, cost, and power consumption can be reduced, and the problem caused by including both digital and analog circuits can be solved. Furthermore, by quantifying an output of the DCO instead of using a clock waveform, it is possible to reduce missing jitter and wander components, which are a drawback of the DCO, to half.

First Example Embodiment

A first example embodiment will now be described in detail with reference to the drawings.

<Configuration of Time Synchronization Device>

Figure 5:
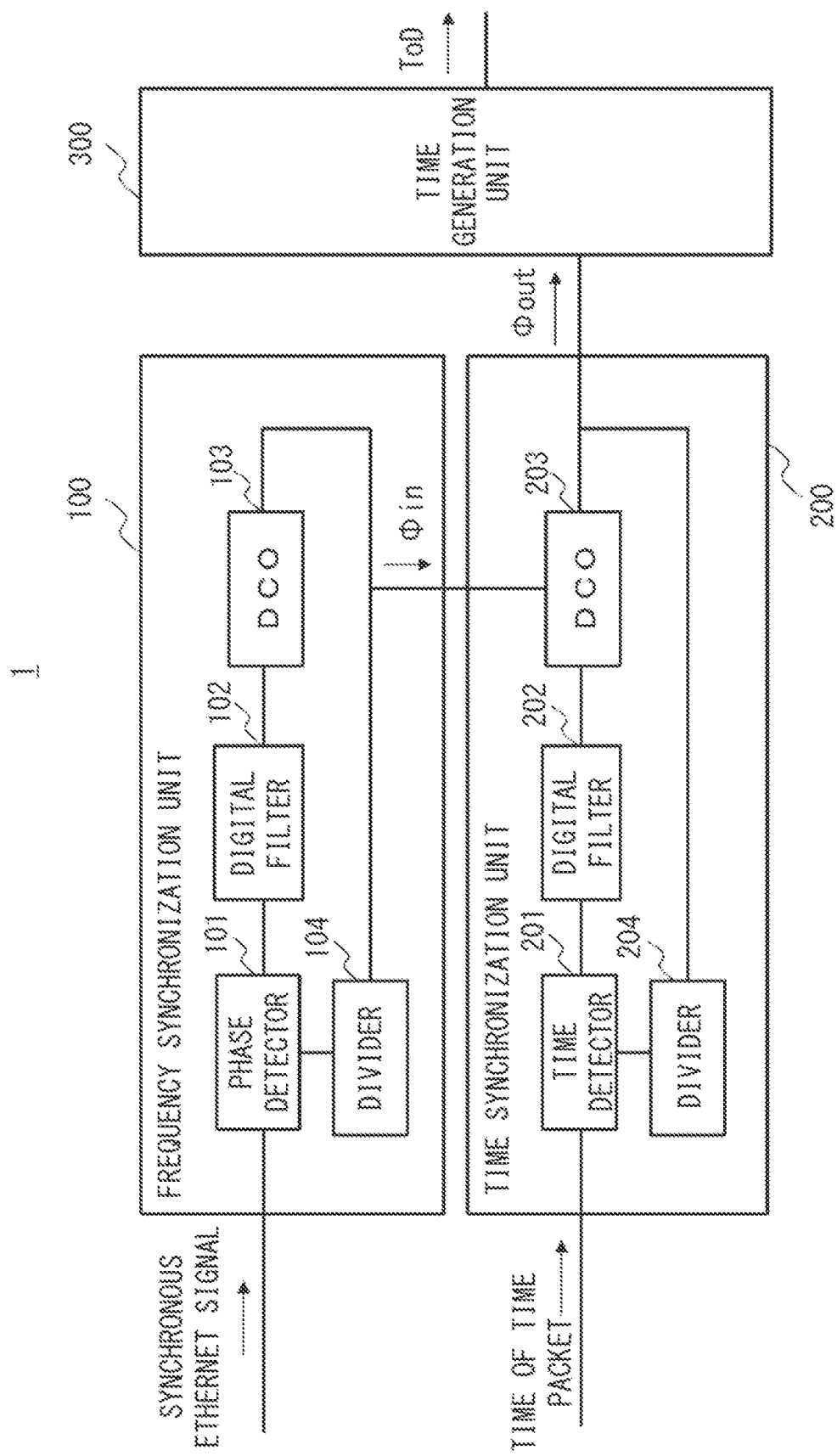
FIG. 5 is a configuration diagram showing a configuration of an equivalent block of the time synchronization device according to a first example embodiment.
Figure 6:
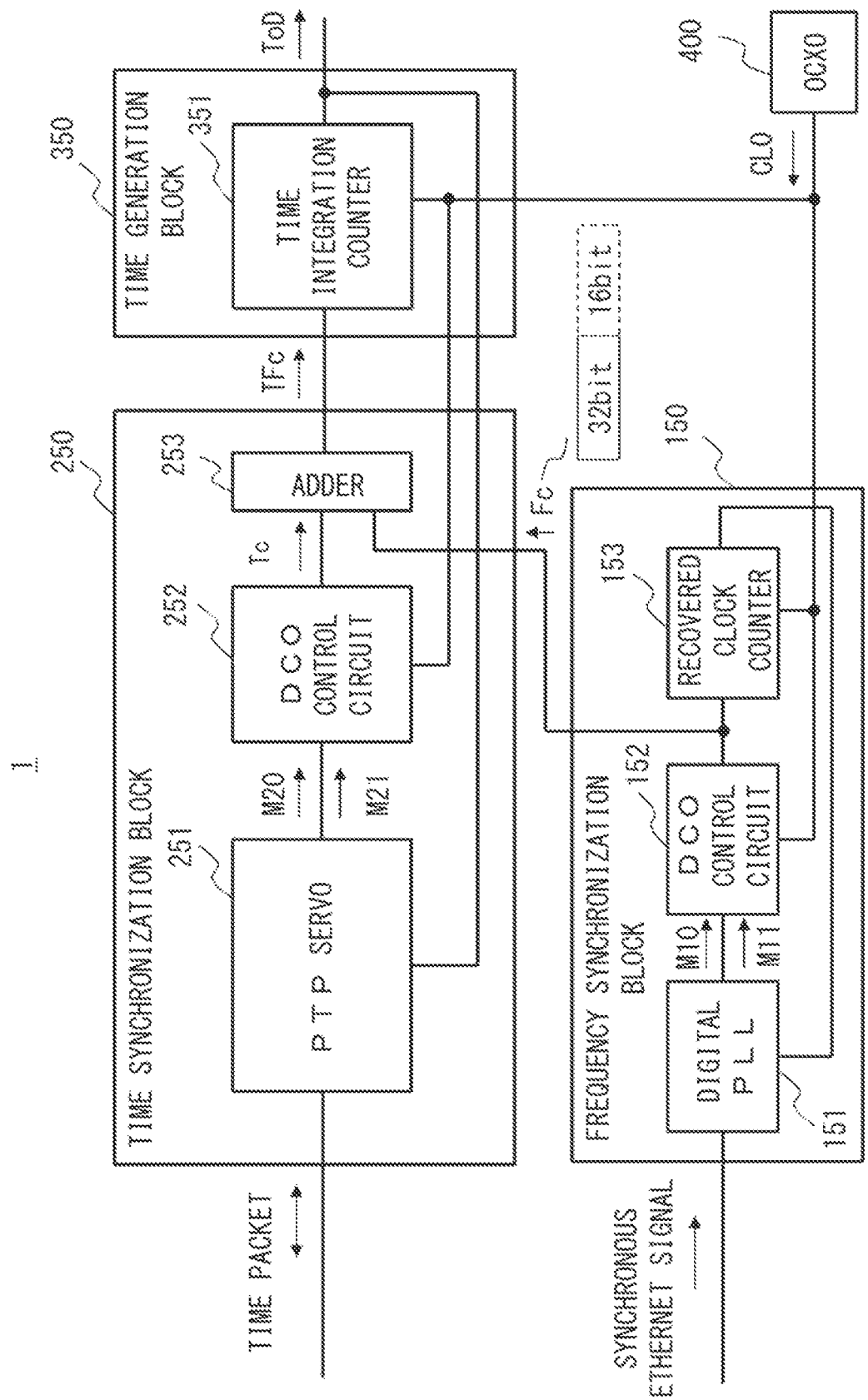
FIG. 6 is a configuration diagram showing a configuration of a logic block of the time synchronization device according to the first example embodiment.

First, a configuration of a time synchronization device according to this example embodiment will be described. FIG. 5 shows a configuration of an equivalent block of a time synchronization device 1 according to this example embodiment. FIG. 6 shows a configuration of a logic block embodying the equivalent block of FIG. 5. The time synchronization device 1 is a slave device that performs time synchronization using a synchronous Ethernet signal and a time packet received from a master device in a manner similar to that in the comparative example.

As shown in FIG. 5, an equivalent block of the time synchronization device 1 according to this example embodiment includes a frequency synchronization unit 100 for performing frequency synchronization processing based on a synchronous Ethernet signal, a time synchronization unit 200 for performing time synchronization processing based on the time of a time packet, and a time generation unit 300 for generating a time synchronization signal based on results of the processing performed by the frequency synchronization unit 100 and the time synchronization unit 200, in a manner similar to that in the comparative example of FIG. 1.

In a manner similar to the comparative example, the frequency synchronization unit 100 includes a phase detector 101, a digital filter 102, and a divider 104, and includes a DCO 103 in place of the VCO 503 according to the comparative example. The phase detector 101, the digital filter 102, the DCO 103, and the divider 104 constitute a frequency synchronizing PLL circuit. The frequency synchronizing PLL circuit generates a synchronization signal Φin (a digital signal) based on the synchronous Ethernet signal, and synchronizes a frequency of the synchronous Ethernet signal with that of the synchronization signal Φin by performing feedback control. The frequency synchronization unit 100 performs PLL processing on the synchronous Ethernet signal received from the master device, and outputs smoothed clock information (Φin) to the time synchronization unit 200.

Specifically, the phase detector (a phase detection unit) 101 receives the synchronous Ethernet signal from the master device and outputs a result of the comparison between the phase of the received synchronous Ethernet signal and that of a divided signal (a recovered clock) from the divider (a recovered clock counter unit) 104. The digital filter (a digital filter unit) 102 completely removes a frequency component (a high frequency component) of the result of phase comparison from the phase detector 101. The DCO (a DCO unit) 103 outputs, to the divider 104 and the DCO 203 in the time synchronization unit 200, a synchronization signal (frequency synchronization numerical value information) Φin of a result (i.e., a frequency corresponding to the result of the phase comparison) of proportional/integral calculation on a numerical value of the result of the phase comparison through the digital filter 102. Further, the divider 104 feeds back a divided signal obtained by dividing the synchronization signal Φin into 1/N to the phase detector 101.

In a manner similar to the comparative example, the time synchronization unit 200 includes a time detector 201, a digital filter 202, and a divider 204, and includes a DCO 203 in place of the VCO 603 of the comparative example. Like the frequency synchronization unit 100, the time detector 201, the digital filter 202, the DCO 203, and the divider 204 constitute a time synchronizing PLL circuit. The time synchronizing PLL circuit generates a synchronization signal (a digital signal) Φout based on the time of the time packet and performs feedback control to synchronize the time of the time packet with the phase (time) of the synchronization signal Φout. The time synchronization unit 200 adds a result of the PLL processing on the time information based on a synchronization packet received from the master device to the clock information (Φin) generated by the frequency synchronization unit 100, and outputs the clock information added with the result of the PLL processing to the time generation unit 300.

Specifically, the time detector (a time detection unit) 201 acquires the result of extracting the time information from time packets T1 to T4 transmitted and received from the master device, and outputs a result of the comparison between the acquired time information and the divided signal (a recovered time) from the divider (a recovered time counter unit) 204. The digital filter (a digital filter unit) 202 completely removes a frequency component (a high frequency component) of the result of the time comparison from the time detector 201.

The DCO (a DCO unit) 203 adds the synchronization signal (frequency synchronization numerical information) Φin from the DCO 103 in the frequency synchronization unit 100 and the synchronization signal (time synchronization numerical information) corresponding to the time comparison result through the digital filter 202, and outputs a result of proportional/integral calculation on a numerical value of the addition as the synchronization signal Φout (a digital signal) to the time generation unit 300 and the divider 204. Thus, the synchronization signal Φout synchronized with the frequency of the synchronous Ethernet signal and synchronized with the time of the time packet is generated. In this example embodiment, high-pass filtering processing is performed in the DCO 203. Further, the divider 204 feeds back, to the time detector 201, a divided signal obtained by dividing the synchronization signal Φout into 1/N.

The time generation unit 300 generates a time synchronization signal (time synchronization information) ToD based on the synchronization signal Φout generated by the time synchronization unit 200. In a manner similar to the comparative example, the time synchronization signal ToD is a clock signal having the same frequency as that of the synchronous Ethernet signal (Φin), and is synchronized with the phase of the time of the time packet.

As shown in FIG. 6, in comparison to the equivalent block of FIG. 5, the logic block of the time synchronization device 1 according to this example embodiment includes a frequency synchronization block 150 corresponding to the frequency synchronization unit 100, a time synchronization block 250 corresponding to the time synchronization unit 200, a time generation block 350 corresponding to the time generation unit 300, and an OCXO 400, in a manner similar to the comparative example of FIG. 2. The OCXO 400 is an oscillator that supplies a clock signal CLO (for example, 250 MHz), which is an original clock, to each circuit.

In a manner similar to the comparative example, the frequency synchronization block 150 includes a digital PLL 151 and a recovered clock counter 153, and includes a DCO control circuit 152 in place of the VC-OCXO 552 of the comparative example. The digital PLL 151 and the recovered clock counter 153 correspond to the phase detector 101, the digital filter 102, and the divider 104 in FIG. 5, and the DCO control circuit 152 corresponds to the DCO 103 in FIG. 5. Thus, the frequency synchronizing PLL can be a full digital circuit.

The digital PLL (a digital PLL unit) 151 includes a phase detection unit for comparing a phase of the synchronous Ethernet signal (synchronous Ethernet information) with that of the recovered clock from the recovered clock counter 153, and a proportional/integral processing unit for performing proportional/integral processing. The digital PLL 151 outputs missing pulse insertion/deletion information M10 and missing pulse cycle information M11 based on the comparison between the synchronous Ethernet signal and the recovered clock. The missing pulse insertion/deletion information is information indicating the number of pulses to be inserted into or deleted from the clock signal in a predetermined period. The missing pulse cycle information is information indicating a cycle of missing pulse insertion/deletion. A frequency of an output signal of DCO can be controlled by using the missing pulse insertion/deletion information and missing cycle information (DCO control information).

The DCO control circuit (a DCO control unit) 152 performs numerical calculation processing based on the DCO control information to control the operation of the DCO (including the DCO). In accordance with the clock signal CLO of the OCXO 400, the DCO control circuit 152 generates the frequency control information (frequency numerical information) Fc, i.e., recovers the frequency, based on the missing pulse insertion/deletion information M10 and the missing pulse cycle information M11 from the digital PLL 151, and outputs the frequency control information Fc to the recovered clock counter 153 and an adder 253 of the time synchronization block 250. This example embodiment is characterized in that the frequency control information Fc output from the DCO control circuit 152 has a decimal part in addition to an integral part due to digital gain processing in the digital PLL 151. For example, the frequency control information Fc has an integral part of 32 bits (a resolution of +4 ns) and a decimal part of 16 bits (resolution of ±a (1 ns)).

The recovered clock counter (a recovered clock counter unit) 153 generates (recovers) the recovered clock based on the frequency control information Fc from the DCO control circuit 152 in accordance with the clock signal CLO of the OCXO 400, and feeds back the generated recovered clock to the digital PLL 151.

In a manner similar to the comparative example, the time synchronization block 250 includes a PTP servo 251, a DCO control circuit 252 in place of the VC-OCXO 652 of the comparative example, and an adder 253. The PTP servo 251 corresponds to the time detector 201, the digital filter 202, and the divider 204 of FIG. 5, and the DCO control circuit 252 and the adder 253 correspond to the DCO 203 in FIG. 5. Thus, the time synchronizing PLL can be a full digital circuit.

The PTP servo unit (a PTP servo unit) 251 includes a time detection unit for performing time comparison between a result of extracting the time information from time packets T1 to T4 and the recovered time (ToD) from the time generation block 350, and a proportional/integral processing unit for performing proportional/integral processing. The PTP servo 251 performs time servo processing in a manner similar to the comparative example. That is, the PTP servo 251 transmits and receives the time packets T1 to T4 to and from the master device, stamps the time in the time packets T2 and T3 based on the ToD signal from the time generation block 350, and obtains the time information from the time packets T1 to T4. Further, in a manner similar to the digital PLL 151 in the frequency synchronization block 150, the PTP servo 251 outputs missing pulse insertion/deletion information M20 and missing pulse cycle information M21 based on the comparison between the time information on the basis of the time packet and the recovered time.

In a manner similar to the DCO control circuit 152, the DCO control circuit (a DCO control unit) 252 performs numerical calculation processing based on the DCO control information to control the operation of the DCO (including the DCO). In accordance with the clock signal CLO of the OCXO 400, the DCO control circuit 252 generates (recovers) the time control information (time numerical information) Tc based on the missing pulse insertion/deletion information M20 and the missing pulse cycle information M21 from the PTP servo 251, and outputs the time control information Tc to the adder 253. In this example embodiment, the time control information Tc output by the DCO control circuit 252 has a decimal part in addition to an integral part due to the digital gain processing in the PTP servo 251, in a manner similar to the DCO control circuit 152 in the frequency synchronization block 150. For example, the time control information Tc is information with a resolution of ±1 ns.

The adder 253 adds the frequency control information Fc from the DCO control circuit 152 in the frequency synchronization block 150 and the time control information Tc from the DCO control circuit 252, and outputs added time frequency control information TFc. For example, the time frequency control information TFc is information with a resolution of (±1 ns)+(4 ns±a).

In a manner similar to the comparative example, the time generation block 350 includes a time integration counter 351. The time integration counter 351 generates a clock signal based on the clock signal CLO of the OCXO 400 according to the time frequency control information TFc from the adder 253, outputs the generated clock signal to the outside as the time synchronization signal ToD, and outputs it to the PTP servo 251 of the time synchronization block 250.

<Time Synchronization Method and Implementation Principle>

Figure 7:
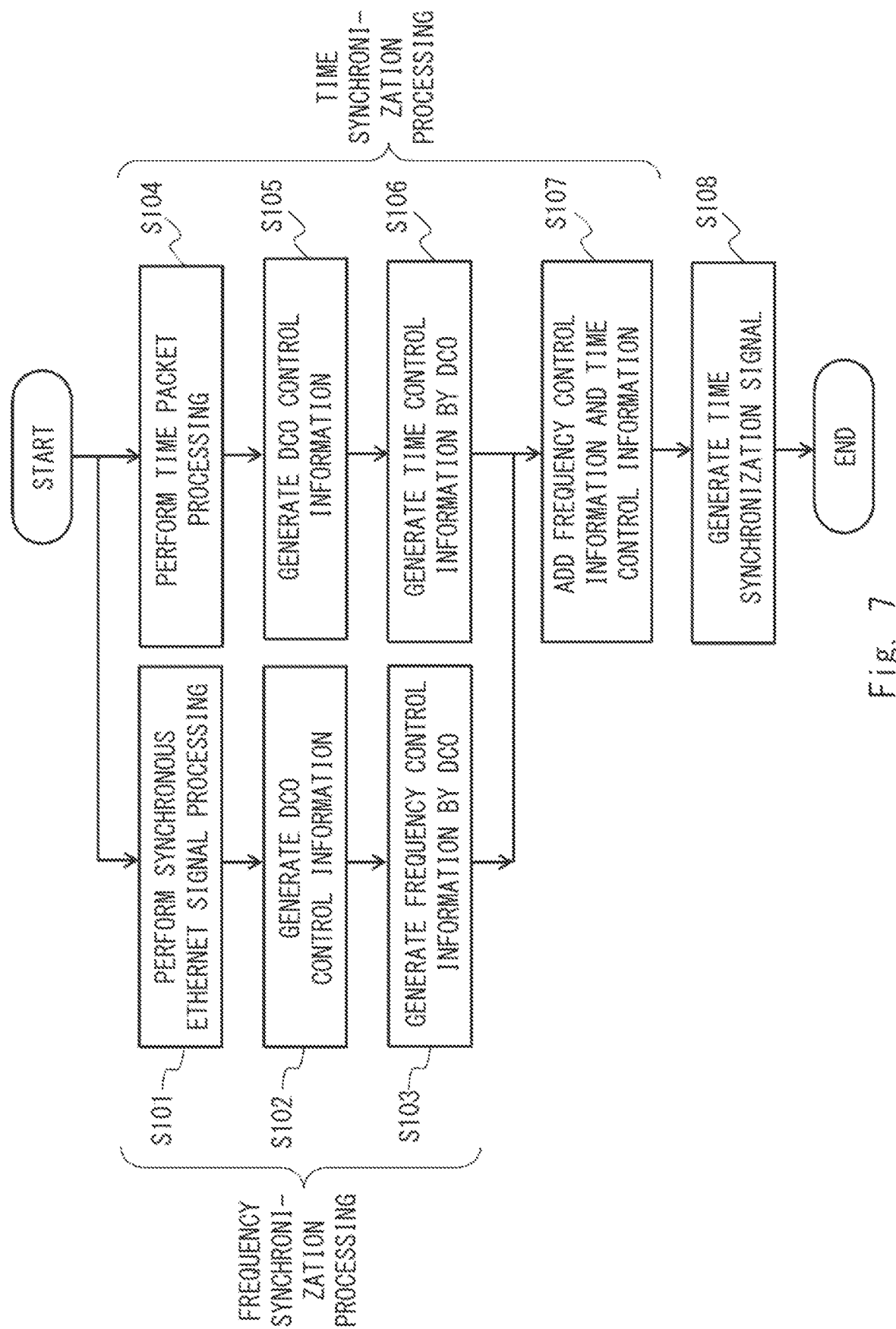
FIG. 7 is a flowchart showing a time synchronization method according to the first example embodiment.

Next, a time synchronization method and an implementation principle of the time synchronization device according to this example embodiment will be described. FIG. 7 shows the time synchronization method according to this example embodiment. This method is a time synchronization method in the time synchronization device 1 shown in FIGS. 5 and 6.

As shown in FIG. 7, the time synchronization device 1 performs frequency synchronization processing (frequency synchronizing PLL processing) (S101 to S103), time synchronization processing (time synchronizing PLL processing) (S104 to S107), and time synchronization signal generation processing (S108). The processing (S107) for adding the frequency control information and the time control information may be included in the time synchronization processing or the frequency synchronization processing, or may be included in the time synchronization signal generation processing. That is, the adder 253 of FIG. 6 may be included in the time synchronization block 250 or the frequency synchronization block 150, or may be included in the time generation block 350.

The frequency synchronization processing is executed by the frequency synchronization block 150 shown in FIG. 6. In the frequency synchronization processing, the frequency synchronization block 150 performs synchronous Ethernet signal processing (S101), DCO control information generation (S102), and frequency control information generation by the DCO (S103), and repeats these processes. By doing so, the function (the frequency synchronizing PLL) of the frequency synchronization unit 100 shown in FIG. 5 is achieved.

That is, the digital PLL 151 extracts frequency information from the synchronous Ethernet signal and generates the DCO control information (the missing pulse insertion/deletion information M10 and the missing pulse cycle information M11) based on the extracted frequency information and feedback information from the recovered clock counter 153. The DCO control circuit 152 generates the frequency control information (Fc) synchronized with the frequency of the synchronous Ethernet signal based on the generated DCO control information.

On the other hand, the time synchronization processing is executed by the time synchronization block 250 of FIG. 6. In the time synchronization processing, the time synchronization block 250 performs time packet processing (S104), DCO control information generation (S105), and time control information generation by the DCO (S106), and repeats these processes. Thus, the function (the time synchronizing PLL) of the time synchronization unit 200 shown in FIG. 5 is achieved.

That is, the PTP servo 251 extracts the time information from the time packets T1 to T4 by the time servo processing, and generates the DCO control information (the missing pulse insertion/deletion information M20 and the missing pulse cycle information M21) based on the extracted time information and feedback information from the time generation block 350. The DCO control circuit 252 generates the time control information (Tc) synchronized with the time of the time packet based on the generated DCO control information.

Following the generation of the frequency control information (S103) and generation of the time control information (S106), the adder 253 of the time synchronization block 250 of FIG. 6 adds the generated frequency control information and the generated time control information (S107). In FIG. 5, since the addition processing is performed in the DCO 203 of the time synchronization unit 200, the DCO control circuit 252 and the adder 253 in FIG. 6 achieve the DCO 203 in FIG. 5.

Further, as the time synchronization signal generation processing, the time generation block 350 of FIG. 6 generates the time synchronization signal (ToD) based on the result of adding the frequency control information and the time control information (S108). Thus, the functions of the time generation unit 300 shown in FIG. 5 are achieved.

As described above, in this example embodiment, a time synchronized with the master device is generated by using the synchronous Ethernet signal received from the master device. Since the synchronous Ethernet signal is transmitted in a physical layer, a synchronizing operation is performed independently of the communication in an upper layer. Therefore, by using the synchronous Ethernet signal, it is possible to generate a highly accurate time which is not affected by packet jitter or wander.

The use of the synchronous Ethernet signal in the time synchronization device of the PTP has already been formally recommended by the ITU-T. A common configuration using the synchronous Ethernet signal defined in ITU-T is shown in the comparative example of FIGS. 1 and 2. As can be understood from the configuration of FIGS. 1 and 2, in the comparative example, the original clock generating the time (ToD) is the synchronous Ethernet signal.

Therefore, in the comparative example, the noise (jitter wander) superimposed on the synchronous Ethernet signal is transmitted as a time, separately from the packet jitter wander caused by the transmission delay of the time packet. In this case, since an amount of wander in the synchronous Ethernet signal defined in ITU-T is on the order of tens of μs, this wander is generated as a time. For this reason, there is a possibility that a time precision "±1.5 μs" defined by TD-LTE and 5G cellular phone base stations may be greatly exceeded, and a shift in the time may cause a radio interference and a lower throughput. In the worst case scenario, wireless lines of the cellular phone base stations themselves could be disconnected.

For this reason, ITU-T recommends that the jitter and wander superimposed on the synchronous Ethernet signal be completely removed when the synchronous Ethernet signal is used in combination with the time generation. However, the ITU-T does not define a method of completely removing the jitter and wander superimposed on the synchronous Ethernet signal, and it is difficult to implement a high-pass filter that completely removes this jitter and wander as in the comparative example before the example embodiment is applied. On the other hand, in this example embodiment, the high-pass filter can be implemented by the configuration of only the frequency synchronization circuit and the time synchronization circuit without mounting a separate high-pass filter.

As shown in FIG. 6, the time synchronization device 1 according to this example embodiment is composed only of the frequency synchronization block 150, the time synchronization block 250, and the time generation block 350, and the basic configuration is similar to that according to the comparative example of FIG. 2. The basic configuration of the equivalent block according to this example embodiment is also similar to that according to the comparative example of FIG. 2.

A major difference between this example embodiment and the comparative example is that, in this example embodiment, a DCO is used instead of a VCO, and DCO numerical information (the frequency control information) from the frequency synchronization block and DCO numerical information (the time control information) from the time synchronization block are added. In this example embodiment, the high-pass filter is achieved by this addition. In order to explain this principle, a loop transfer function of the equivalent block shown in FIG. 5 is obtained as follows.

First, as shown in the following Equations (1) and (2), transmission characteristics F(s) of the digital filters 102 and 202, the conversion gains Kd of the phase detector 101 and the time detector 201, conversion gains Kdco/s of the DCOs 103 and 203, and conversion gains 1/N of the dividers 104 and 204 are defined.

[Mathematical 1]

$$F(s) = 1 \quad \text{Equation (1)}$$

$$K = \left(Kd \cdot \frac{Kdco}{s} \cdot \frac{1}{N}\right) = 1 \quad \text{Equation (2)}$$

Using the conversion gain K of Equation (2) from the equivalent block of FIG. 5, the relationship between the synchronization signal Φin generated by the frequency synchronization unit 100 and the synchronization signal Φin generated by the time synchronization device 200 is expressed by the following Equation (3). Further, if the Equation (3) is modified, Φout becomes the following Equation (4).

$$\Phi out(s) = (-K \cdot \Phi out) + \Phi in \quad \text{Equation (3)}$$

$$\Phi out(s) + K \cdot \Phi out = \Phi in$$

$$(1 + K)\Phi out(s) = \Phi in$$

$$\Phi out(s) = \frac{\Phi in}{1 + K} \quad \text{Equation (4)}$$

Then, a transfer function H(s) of the equivalent block is obtained by the following Equation (5) using the Equation (4).

[Mathematical 3]

$$H(s) = \frac{\Phi out(s)}{\Phi in(s)} = \frac{\frac{\Phi in(s)}{1+k}}{\Phi in(s)} = \frac{\Phi in(s)}{\Phi in(s) + K\Phi in(s)} = \frac{1}{1+K} \quad \text{Equation (5)}$$

When Equations (1) and (2) are substituted into Equation (5), the following Equation (6) is given, and when Equation (6) is modified, the transfer function H(s) becomes Equation (7).

[Mathematical 4]

$$H(s) = \frac{1}{1 + Kd \cdot F(s) \cdot \frac{Kdco}{s} \cdot \frac{1}{N}} \quad \text{Equation (6)}$$

$$= \frac{1}{1 + Kd \cdot F(s) \cdot Kdco \cdot \frac{1}{N} \cdot \frac{1}{s}} \quad \text{Equation (7)}$$

Here, the s-plane and the complex plane have a relationship of s=jω. Using this relationship, a frequency transfer function H(jω) becomes the following Equation (8) from Equation (7).

[Mathematical 5]

$$H(j\omega) = \frac{1}{1 + Kd \cdot F(s) \cdot Kdco \cdot \frac{1}{N} \cdot \frac{1}{j\omega}} \quad \text{Equation (8)}$$

A gain (absolute value) of the frequency transfer function H (jω) in Equation (8) can be expressed by the following Equation (9). Further, from the relation ω=2 πf, Equation (9) can be expressed as Equation (10).

[Mathematical 6]

$$|H(j\omega)| = \frac{1}{\sqrt{1 + \left(Kd \cdot F(s) \cdot Kdco \cdot \frac{1}{N} \cdot \frac{1}{\omega}\right)^2}} \quad \text{Equation (9)}$$

$$= \frac{1}{\sqrt{1 + \left(Kd \cdot F(s) \cdot Kdco \cdot \frac{1}{N} \cdot \frac{1}{2\pi f}\right)^2}} \quad \text{Equation (10)}$$

This Equation (10) shows a frequency response of the equivalent block of FIG. 5. According to the Equation (10), when the frequency becomes lower, $\frac{1}{2\pi f}$ becomes larger, and a value of a denominator becomes larger than 1, so that a gain decreases. Therefore, the characteristics of the high-pass filter can be achieved by the equivalent block of FIG. 5.

Figure 8:
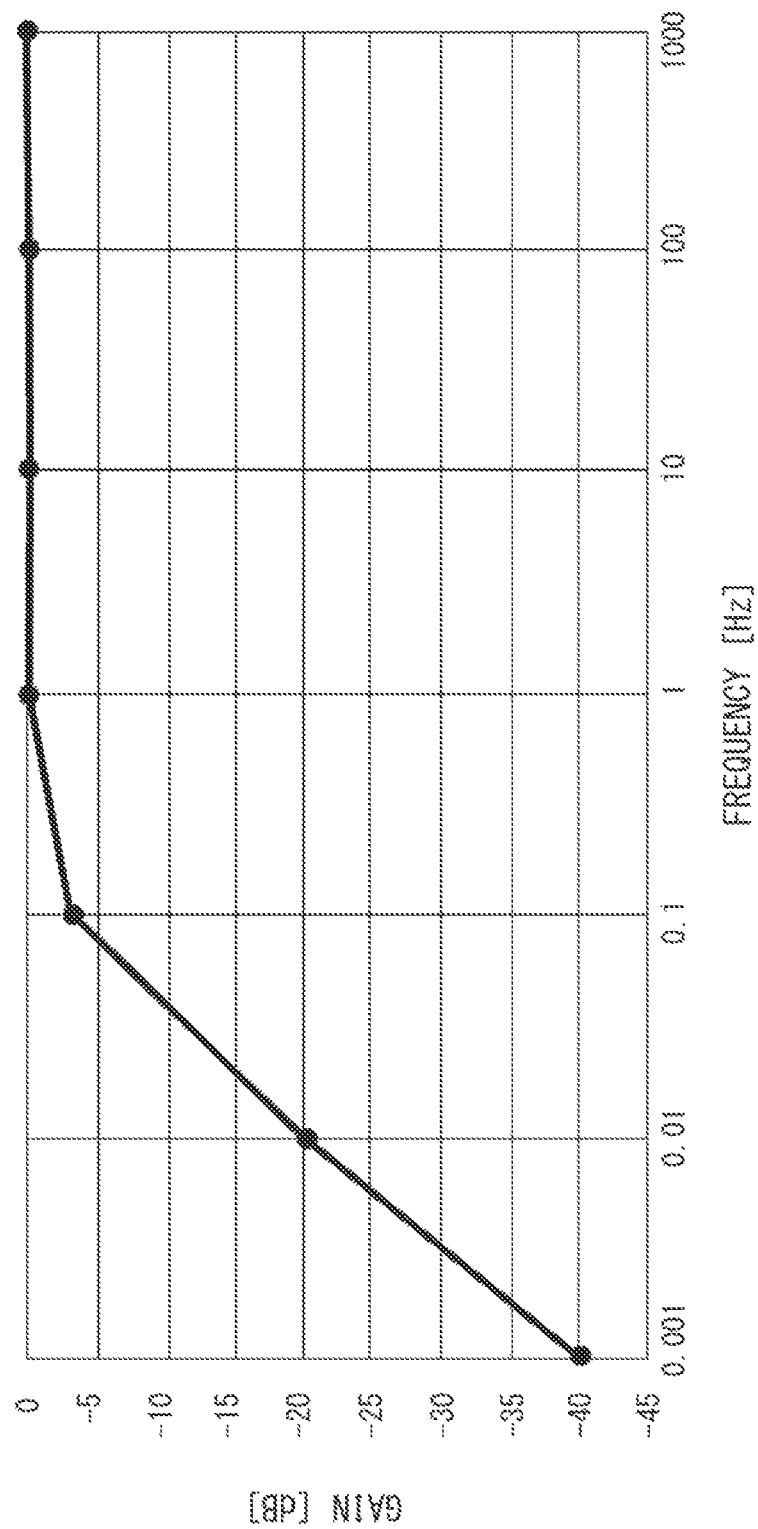
FIG. 8 is a graph showing frequency characteristics in the time synchronization device according to the first example embodiment.

FIG. 8 shows characteristics of the frequency transfer function H(jω) obtained by Equation (10). That is, the frequency characteristics of the synchronization signal Φout for the noise of the synchronous Ethernet signal in the equivalent block of FIG. 5 are shown. As shown in FIG. 8, the frequency characteristic for the synchronous Ethernet signal is the characteristic of a high-pass filter which cuts the low frequency and transmits the high frequency. In this example, the gain greatly attenuates below 0.1 Hz. Therefore, it is possible to prevent or reduce an extremely low frequency wander of 0.1 Hz or less superimposed on the synchronous Ethernet signal. Therefore, a high-pass filter that eliminates frequencies below "0.1 Hz", which is the loop band of the time synchronization unit (the PTP servo unit) in terms of transmission characteristics, is achieved.

Figure 9:
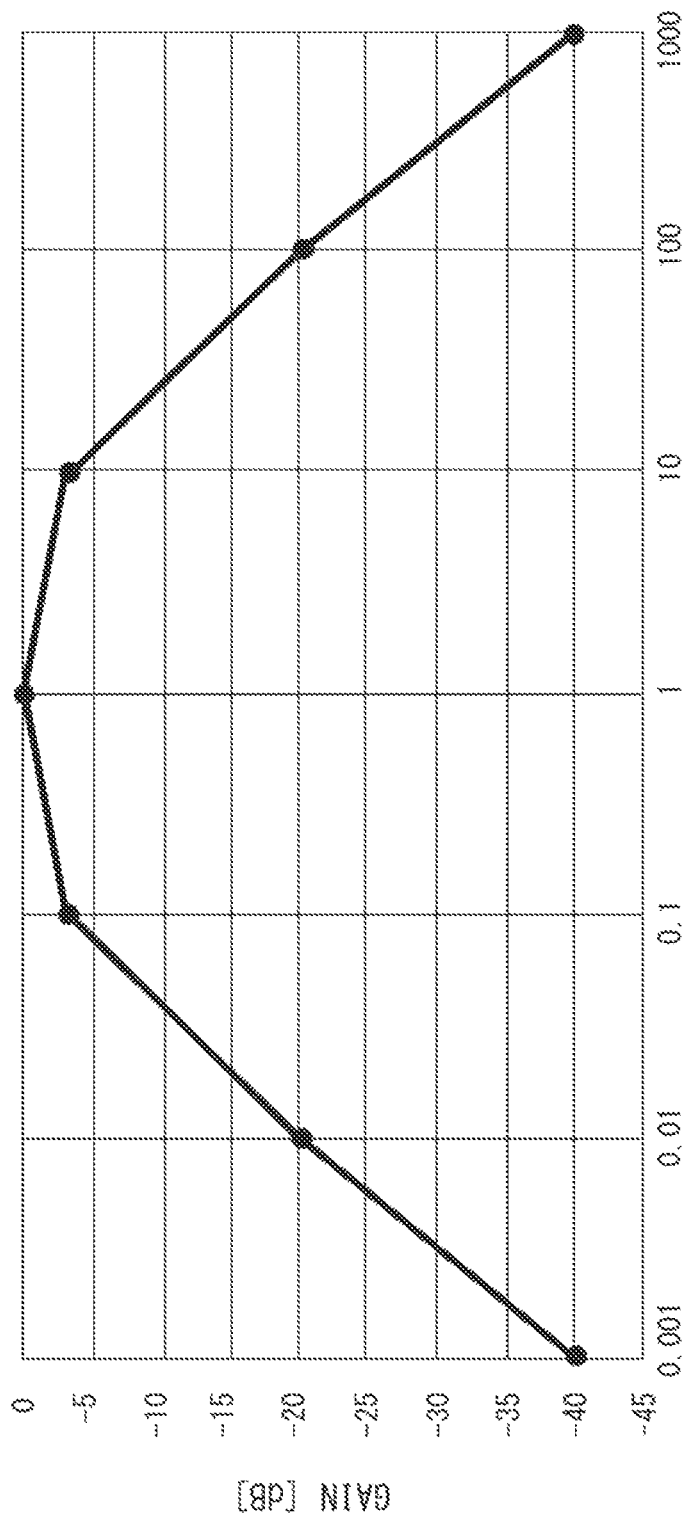
FIG. 9 is a graph showing frequency characteristics in the time synchronization device according to the first example embodiment.

FIG. 9 shows the frequency characteristics of the synchronization signal Φout for the noise of the synchronous Ethernet signal and the time (the time signal based on the time packet) in the equivalent block of FIG. 5. That is, the frequency characteristics of the entire time synchronization device including the frequency synchronization unit and the time synchronization unit are shown. The transfer function of the entire time synchronization device is obtained by adding the transfer characteristics of the time synchronization unit to Equation (10). As shown in FIG. 9, the frequency characteristics with respect to the synchronous Ethernet signal and time are the characteristic of a bandpass filter that cuts the low frequency and the high frequency and transmits the intermediate frequency. In this example, the gain is greatly attenuated at 0.1 Hz or less and at 10 Hz or more. This achieves the frequency characteristics defined in ITU-T G.8273.2.

In this example embodiment, by configuring two PLLs using DCOs, a high-pass filter can be achieved, and further, the number of oscillators can be reduced. Further, by making the PLL a full logic circuit, it is possible to reduce the number of analog circuits that are easily affected by operating environments such as power supply fluctuations and temperature fluctuations. This enables reduction of the mounting area, cost, and power consumption.

On the other hand, if the PLL is configured to include a DCO (DCO type PLL), there is a risk that the missing jitter and wander components of the original clock of the DCO is generated. By way of example, when the original clock of the DCO is 250 MHz (4 ns cycle), missing jitter and wander components of 125 MHz (8 ns cycle) is generated in the two-stage configuration of the DCO type PLL. That is, since the counter of the missing clock has a two-stage configuration, the missing jitter wander components are 4 ns×2=8 ns.

On the other hand, in this example embodiment, as shown in FIG. 6, the synchronous Ethernet signal and the time are processed as numerical values without making them into clock waveforms. Thus, the missing jitter wander components can be controlled to 250 MHz (4 ns).

In this example embodiment, the frequency control information Fc (processing resolutions of the digital PLL 151 and the DCO control circuit 152) in FIG. 6 has decimal digits in addition to integers. Thus, even if a digital gain in the proportional/integral processing is reduced, the generation of quantization noise can be prevented or reduced.

More specifically, in this example embodiment, the DCO control circuit 152 converts a digital value calculated by the phase detector in the digital PLL 151 shown in FIG. 6 or the digital amplifier and integrator into a DCO control value. For example, when a phase detection frequency of 8 KHz is sampled at 250 MHz, a phase detection value varies within a range of ±15625 d. Then, 2^15 counter values are required. In practice, in consideration of the loop band (0.1 Hz) of the PLL, a digital amplifier is applied (amplified) to the phase detection value within the digital PLL. For example, when the digital amplifier gain is ×½^12, the MSB side 3 bits of original data enter an integral part of the LSB side 32 bits of the frequency control information Fc, and the remaining 13 bits of the original data enter the decimal part of the MSB side 16 bits of the frequency control information Fc. Although a counter resolution in the frequency control information Fc may be 4 ns, it is preferable that the counter resolution be a result of dividing the frequency control information Fc by 4 ns in advance in order to facilitate verification on operations and to unify the resolution and concept of the time synchronization unit.

<Effect of First Example Embodiment>

As described above, in this example embodiment, as shown in FIG. 6, in a time generation device, the frequency synchronizing PLL and the time synchronizing PLL are DCO type PLLs, and numerical calculation processing is performed between the DCOs, and the DCO control resolution is reduced to a decimal (including a decimal part). As a result, it is possible to achieve a time generation device having features that time synchronization information using a synchronous Ethernet signal is prevented from being affected by superimposed noise (jitter wander) of the synchronous Ethernet signal, DCO missing jitter wander components can be reduced to half, and a quantization noise can be prevented from being generated, because a significant digit will not be cancelled even when the loop band of the PLL is lowered.

Note that the present disclosure is not limited to the above-described example embodiment, and may be changed as appropriate without departing from the spirit. For example, the present disclosure may be applied not only to the standard described above but also to other standards for frequency synchronization and time synchronization.

The whole or part of the example embodiments disclosed above can be described as, but not limited to, the following supplementary notes.

(Supplementary Note 1)

A time synchronization device comprising:
  a frequency synchronization unit configured to generate frequency control information synchronized with a frequency of a synchronous Ethernet (registered trademark) signal received from a time master device;
  a time synchronization unit configured to generate time control information synchronized with a time based on a time packet received from the time master device; and
  a time synchronization signal generation unit configured to generate a time synchronization signal based on the generated frequency control information and the generated time control information, wherein
  the frequency synchronization unit includes a frequency synchronizing PLL (Phase Locked Loop) including a first digital controlled oscillator configured to output the frequency control information, and
  the time synchronization unit includes a time synchronizing PLL including a second digital controlled oscillator configured to output the time control information.

(Supplementary Note 2)

The time synchronization device according to Supplementary note 1, wherein the time synchronization signal generation unit is configured to generate the time synchronization signal based on an addition value obtained by adding the frequency control information and the time control information.

(Supplementary Note 3)

The time synchronization device according to Supplementary note 2, wherein
the time synchronization unit includes an addition unit configured to add the frequency control information and the time control information, and
the time synchronization signal generation unit is configured to generate the time synchronization signal based on the added value obtained by the addition unit.

(Supplementary Note 4)

The time synchronization device according to Supplementary note 2, wherein
the second digital controlled oscillator is configured to output the added value obtained by adding the frequency control information output from the first digital controlled oscillator and the time control information, and
the time synchronization signal generation unit is configured to generate the time synchronization signal based on the output added value.

(Supplementary Note 5)

The time synchronization device according to any one of Supplementary notes 1 to 4, wherein
the frequency synchronizing PLL and the time synchronizing PLL constitute a high-pass filter for removing a low frequency component of the synchronous Ethernet signal.

(Supplementary Note 6)

The time synchronization device according to any one of Supplementary notes 1 to 5, wherein
the frequency synchronizing PLL and the time synchronizing PLL are full digital circuits.

(Supplementary Note 7)

The time synchronization device according to any one of Supplementary notes 1 to 6, wherein
the first digital controlled oscillator and the second digital controlled oscillator perform numerical calculation processing to generate the frequency control information and the time control information, respectively.

(Supplementary Note 8)

The time synchronization device according to any one of Supplementary notes 1 to 7, wherein
each of the frequency control information and the time control information includes an integral part and a decimal part.

(Supplementary Note 9)

A time synchronization system comprising:
a time master device and a time slave device, wherein the time slave device comprises:
    a frequency synchronization unit configured to generate frequency control information synchronized with a frequency of a synchronous Ethernet (registered trademark) signal received from a time master device;
    a time synchronization unit configured to generate time control information synchronized with a time based on a time packet received from the time master device; and
    a time synchronization signal generation unit configured to generate a time synchronization signal based on the generated frequency control information and the generated time control information, the frequency synchronization unit includes a frequency synchronizing PLL (Phase Locked Loop) including a first digital controlled oscillator configured to output the frequency control information, and
the time synchronization unit includes a time synchronizing PLL including a second digital controlled oscillator configured to output the time control information.

(Supplementary Note 10)

The time synchronization device according to Supplementary note 9, wherein the time synchronization signal generation unit is configured to generate the time synchronization signal based on an addition value obtained by adding the frequency control information and the time control information.

(Supplementary Note 11)

A time synchronization method comprising:
generating, by a first digital controlled oscillator included in a frequency synchronizing PLL (Phase Locked Loop), control information synchronized with a frequency of a synchronous Ethernet (registered trademark) signal received from a time master device;
generating, by a second digital controlled oscillator included in a time synchronizing PLL, time control information synchronized with a time based on a time packet received from the time master device; and
generating a time synchronization signal based on the generated frequency control information and the generated time control information.

(Supplementary Note 12)

The time synchronization method according to Supplementary note 11, wherein
in the generation of the time synchronization signal, the time synchronization signal is generated based on an addition value obtained by adding the frequency control information and the time control information.

Although the present disclosure has been described with reference to the example embodiments, the present disclosure is not limited by the above. The configuration and details of the present disclosure may be modified in various ways that will be understood by those skilled in the art within the scope of the disclosure.

This application claims priority on the basis of Japanese Patent Application No. 2020-018117, filed Feb. 5, 2020, the entire disclosure of which is incorporated herein by reference.

REFERENCE SIGNS LIST

1 TIME SYNCHRONIZATION DEVICE
10 SLAVE DEVICE
11 FREQUENCY SYNCHRONIZATION UNIT
11a DCO
12 TIME SYNCHRONIZATION UNIT
12a DCO
13 TIME SYNCHRONIZATION SIGNAL GENERATION UNIT
20 MASTER DEVICE
30 TIME SYNCHRONIZATION SYSTEM
100 FREQUENCY SYNCHRONIZATION UNIT
101 PHASE DETECTOR
102 DIGITAL FILTER
103 DCO
104 DIVIDER
150 FREQUENCY SYNCHRONIZATION BLOCK
151 DIGITAL PLL
152 DCO CONTROL CIRCUIT
153 RECOVERED CLOCK COUNTER

200 TIME SYNCHRONIZATION UNIT
201 TIME DETECTOR
202 DIGITAL FILTER
203 DCO
204 DIVIDER
250 TIME SYNCHRONIZATION BLOCK
251 PTP SERVO
252 DCO CONTROL CIRCUIT
253 ADDER
300 TIME GENERATION UNIT
350 TIME GENERATION BLOCK
351 TIME INTEGRATION COUNTER

What is claimed is:

1. A time synchronization device comprising:
a frequency synchronizer generating frequency control information synchronized with a frequency of a synchronous Ethernet (registered trademark) signal received from a time master device;
a time synchronizer generating time control information synchronized with a time based on a time packet received from the time master device; and
a time synchronization signal generator generating a time synchronization signal based on the generated frequency control information and the generated time control information, wherein
the frequency synchronizer includes a frequency synchronizing PLL (Phase Locked Loop) including a first digital controlled oscillator outputting the frequency control information,
the time synchronizer includes a time synchronizing PLL including a second digital controlled oscillator outputting the time control information,
the first digital controlled oscillator and the second digital controlled oscillator perform numerical calculation processing to generate the frequency control information that is numerical information and the time control information that is numerical information, respectively,
the time synchronization signal generator generates the time synchronization signal based on an addition value obtained by adding the frequency control information and the time control information, and
the frequency synchronizing PLL and the time synchronizing PLL constitute a high-pass filter for removing a low frequency component of the synchronous Ethernet signal.

2. The synchronization device according to claim 1, wherein
the time synchronizer includes adder adding the frequency control information and the time control information, and
the time synchronization signal generator generates the time synchronization signal based on the added value obtained by the adder.

3. The synchronization device according to claim 2, wherein
the frequency synchronizer includes a digital PLL processor and a recovered clock counter,
the digital PLL processor performs a phase comparison between the synchronous Ethernet signal and the recovered clock from the recovered clock counter,
the first digital controlled oscillator generates the frequency control information based on a result of the phase comparison,
the recovered clock counter generates the recovered clock based on the frequency control information,
the time synchronizer includes a PTP (Precision Time Protocol) servo processor,
the PTP servo processor performs a time comparison between a time based on the time packet and the time synchronization signal from the time synchronization signal generator, and
the second digital controlled oscillator generates the time control information based on a result of the time comparison.

4. The synchronization device according to claim 2, claim 1, wherein
the second digital controlled oscillator outputs the added value obtained by adding the frequency control information output from the first digital controlled oscillator and the time control information, and
the time synchronization signal generator generates the time synchronization signal based on the output added value.

5. The synchronization device according to claim 4, wherein
the frequency synchronizer includes a phase detector, a first digital filter, and a first divider,
the phase detector outputs a result of a phase comparison between the synchronous Ethernet signal and a first divided signal from the first divider,
the first digital filter removes a high frequency component of the result of the phase comparison,
the first digital controlled oscillator generates the frequency control information based on the result of the phase comparison from which the high frequency component is removed,
the first divider divides the frequency control information to generate the first divided signal,
the time synchronizer includes a time detector, a second digital filter, and a second divider,
the time detector outputs a result of a time comparison between a time based on the time packet and a second divided signal from the second divider,
the second digital filter removes a high frequency component of the result of the time comparison,
the second digital controlled oscillator adds the frequency control information from the first digital controlled oscillator and the time control information according to the result of the time comparison from which the high frequency component is removed, and
the second divider divides the added result to generate the second divided signal.

6. The time synchronization device according to claim 1, wherein
the frequency synchronizing PLL and the time synchronizing PLL are full digital circuits.

7. The time synchronization device according to claim 1, wherein
each of the frequency control information and the time control information includes an integral part and a decimal part.

8. A time synchronization system comprising:
a time master device and a time slave device, wherein the time slave device comprises:
a frequency synchronizer generating frequency control information synchronized with a frequency of a synchronous Ethernet (registered trademark) signal received from a time master device;
a time synchronizer generating time control information synchronized with a time based on a time packet received from the time master device; and a time synchronization signal generator generating a time synchronization signal based on the generated frequency control information and the generated time control information, the frequency synchronizer includes a frequency synchronizing PLL (Phase Locked Loop) including a first digital controlled oscillator outputting the frequency control information, the time synchronizer includes a time synchronizing PLL including a second digital controlled oscillator outputting the time control information, the first digital controlled oscillator and the second digital controlled oscillator perform numerical calculation processing to generate the frequency control information that is numerical information and the time control information that is numerical information, respectively, the time synchronization signal generator generates the time synchronization signal based on an addition value obtained by adding the frequency control information and the time control information, and the frequency synchronizing PLL and the time synchronizing PLL constitute a high-pass filter for removing a low frequency component of the synchronous Ethernet signal.

9. A time synchronization method comprising:

generating, by a first digital controlled oscillator included in a frequency synchronizing PLL (Phase Locked Loop), control information synchronized with a frequency of a synchronous Ethernet (registered trademark) signal received from a time master device;

generating, by a second digital controlled oscillator included in a time synchronizing PLL, time control information synchronized with a time based on a time packet received from the time master device; and generating a time synchronization signal based on the generated frequency control information and the generated time control information, wherein the first digital controlled oscillator and the second digital controlled oscillator perform numerical calculation processing to generate the frequency control information that is numerical information and the time control information that is numerical information, respectively, in the generating of the time synchronization signal, the time synchronization signal is generated based on an addition value obtained by adding the frequency control information and the time control information, the frequency synchronizing PLL and the time synchronizing PLL constitute a high-pass filter for removing a low frequency component of the synchronous Ethernet signal.

\* \* \* \* \*